(12) United States Patent
Enokido

(10) Patent No.: US 7,108,733 B2
(45) Date of Patent: Sep. 19, 2006

(54) METAL SLURRY FOR ELECTRODE FORMATION AND PRODUCTION METHOD OF THE SAME

(75) Inventor: Yasushi Enokido, Chiba (JP)

(73) Assignee: Massachusetts Institute of Technology, Cambridge, MA (US)

( * ) Notice: Subject to any disclaimer, the term of this patent is extended or adjusted under 35 U.S.C. 154(b) by 94 days.

(21) Appl. No.: 10/601,272

(22) Filed: Jun. 20, 2003

(65) Prior Publication Data

US 2005/0016325 A1 Jan. 27, 2005

(51) Int. Cl.
*B22F 1/00* (2006.01)
*H01B 1/22* (2006.01)

(52) U.S. Cl. .......................... 75/252; 252/512; 252/514

(58) Field of Classification Search ................. 75/252; 252/512, 513, 514
See application file for complete search history.

(56) References Cited

U.S. PATENT DOCUMENTS

| | | | |
|---|---|---|---|
| 4,904,411 A * | 2/1990 | Novich et al. ................. 516/33 |
| 5,204,055 A | 4/1993 | Sachs et al. |
| 5,348,760 A * | 9/1994 | Parker et al. .................... 427/9 |
| 6,103,393 A * | 8/2000 | Kodas et al. ................ 428/570 |
| 6,277,169 B1 * | 8/2001 | Hampden-Smith et al. ... 75/336 |
| 6,375,868 B1 * | 4/2002 | Shimizu et al. .............. 252/512 |
| 6,596,224 B1 | 7/2003 | Sachs et al. |

FOREIGN PATENT DOCUMENTS

| JP | 06-218712 | 8/1994 |
|---|---|---|
| JP | 2002-299833 | 10/2002 |
| WO | WO 98/56566 | 12/1998 |

OTHER PUBLICATIONS

Sands, R.L. et al., Powder Metallurgy Practice and Applications, 1966, pp. 27-28.*
Sachs, E., Cima, M., Williams, P., Brancazio, D., Corine, J., Three Dimensional Printing: Rapid Tooling and Prototypes Directly from a CAD Model, Journal of Engineering for Industry, Nov. 1992, vol. 114, p. 481-488.
Grau, J., Moon, J., Uhland, S., Cima, M., Sachs, E., High green density ceramic components fabricated by the slurry-based 3DP process, Solid Freeform Fabrication Proceedings, 1997, p. 371-378.
Enokido, Y. (TDK Corporation), Conductor Formation in the Solid Freeform Fabrication Technique, Cermaics 36, 2001, No. 6, p. 421-424.

* cited by examiner

*Primary Examiner*—Ngoclan T. Mai
(74) *Attorney, Agent, or Firm*—Steven J. Weissburg

(57) ABSTRACT

The present invention provides a metal slurry for electrode formation which slurry is high in dispersion property and enables formation of high density electrode films. The metal slurry for electrode formation is composed of a spherical metal powder of 0.1 to 2.0 μm in mean particle size and a dispersion medium. By making the spherical metal powder have a mean particle size falling within the range from 0.1 to 2.0 μm, there can be obtained a metal slurry for electrode formation which slurry can be coated through a nozzle and is high in dispersion property, without using expensive nanoparticles. In addition, as the dispersion medium, water or lower molecular weight alcohols can be used. Furthermore, the dispersion property can be improved by further adding a dispersant of 10 wt % or below (exclusive of zero) in relation to the metal powder.

16 Claims, 12 Drawing Sheets

Fig. 1

| Sample No. | Metal Powder | Kind of Powder | Tap Density (g/cc) | Mean Particle Size (μm) | Specific Surface Area (m²/g) | Sediment Density (%) | Name of Product |
|---|---|---|---|---|---|---|---|
| 1 | Ag/Pd | Pulverized Powder | 0.9 | 1.0 | 1.39 | 32.3 | 09-630 manufactured by Technic, Inc. |
| 2 | Ag | Pulverized Powder | 0.5 | 0.6 | 2.70 | 27.8 | Silpowder 188 manufactured by Technic, Inc. |
| 3 | Ag | Pulverized Powder | 1.0 | 0.7 | 6.66 | 22.2 | Silpowder 416 manufactured by Technic, Inc. |
| 4 | Ag | Pulverized Powder | 2.4 | 10.0 | 0.92 | 41.7 | Silflake 556 manufactured by Technic, Inc. |
| 5 | Ag | Chemically Synthesized Powder (Spherical Powder) | 3.2 | 1.0 | 0.90 | 62.5 | Silpowder 335 manufactured by Technic, Inc. |
| 6 | Ag | Chemically Synthesized Powder (Spherical Powder) | 3.8 | 0.8 | 1.21 | 62.5 | Silsphare 517 manufactured by Technic, Inc. |
| 7 | Ag | Chemically Synthesized Powder (Spherical Powder) | 4.3 | 0.65 | 1.97 | 62.5 | SPQ03J manufactured by Mitsui Metal Co. |
| 8 | Ag | Chemically Synthesized Powder (Spherical Powder) | 4.43 | 1.2 | 1.10 | 55.6 | SPQ05J manufactured by Mitsui Metal Co. |
| 9 | Ag | Chemically Synthesized Powder (Spherical Powder) | 4.55 | 1.5 | 0.50 | 55.6 | Ag128 manufactured by Shoei Chemical, Inc. |

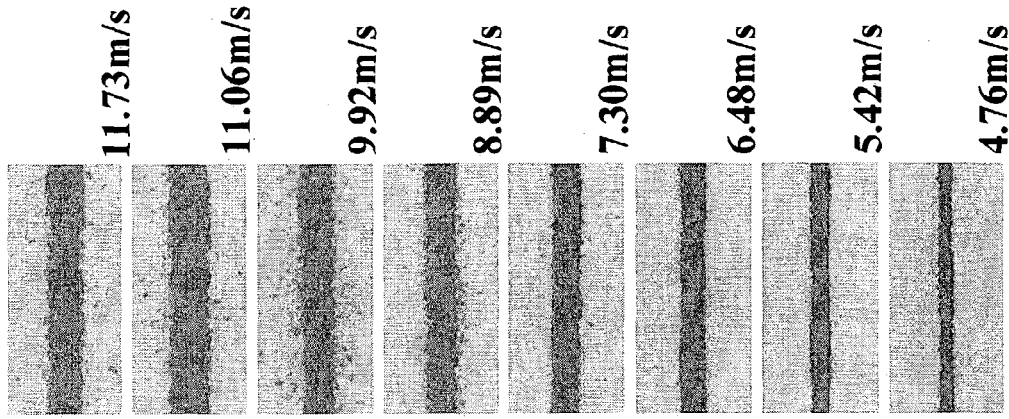
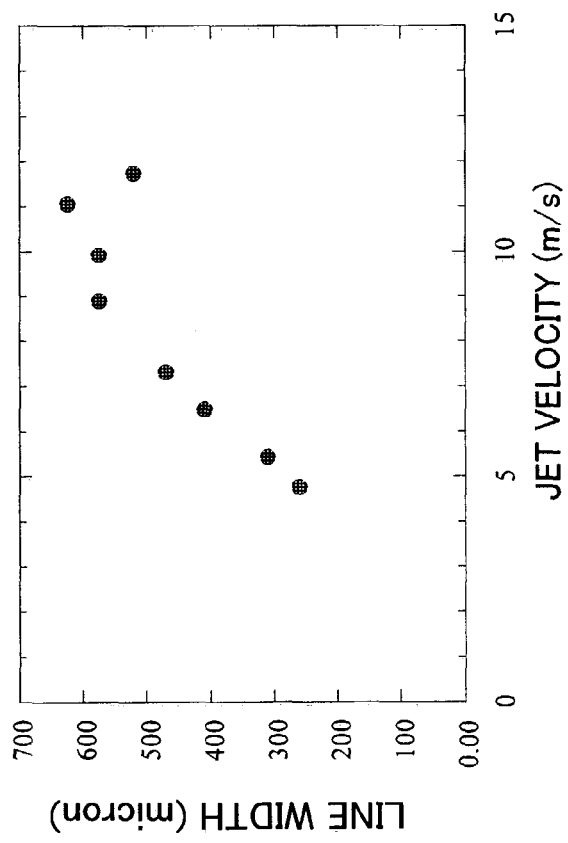
Fig. 8A
Fig. 8B

Fig. 9A
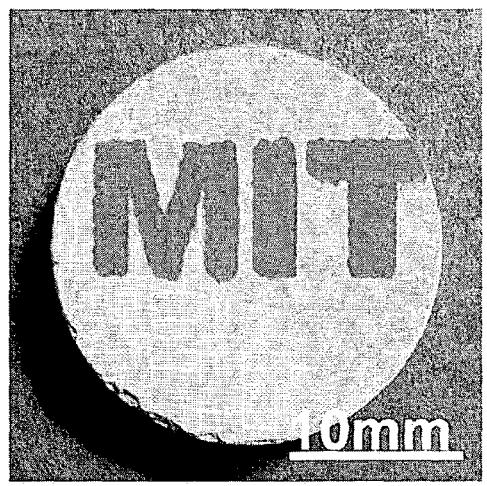
Electrode pattern
Fig. 9B
Green body
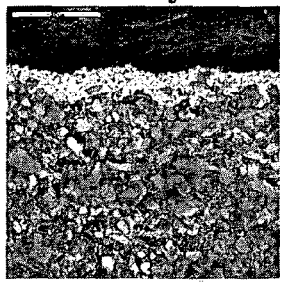 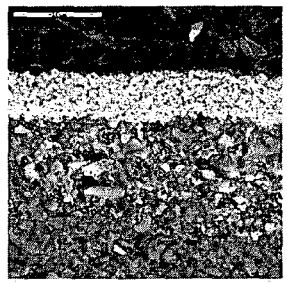 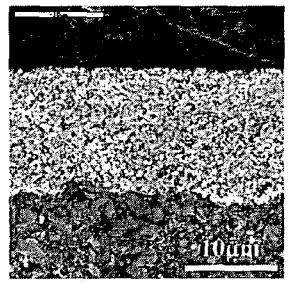
1 layer        3 layers        10 layers
Fired body
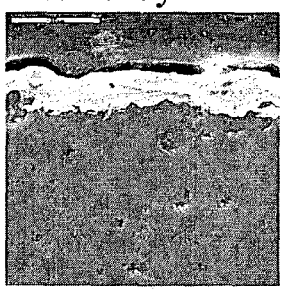 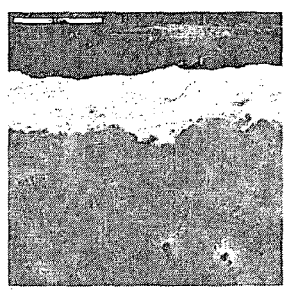 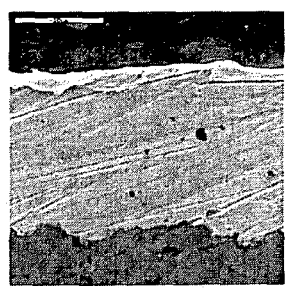
1 layer        3 layers        10 layers
Cross Sections

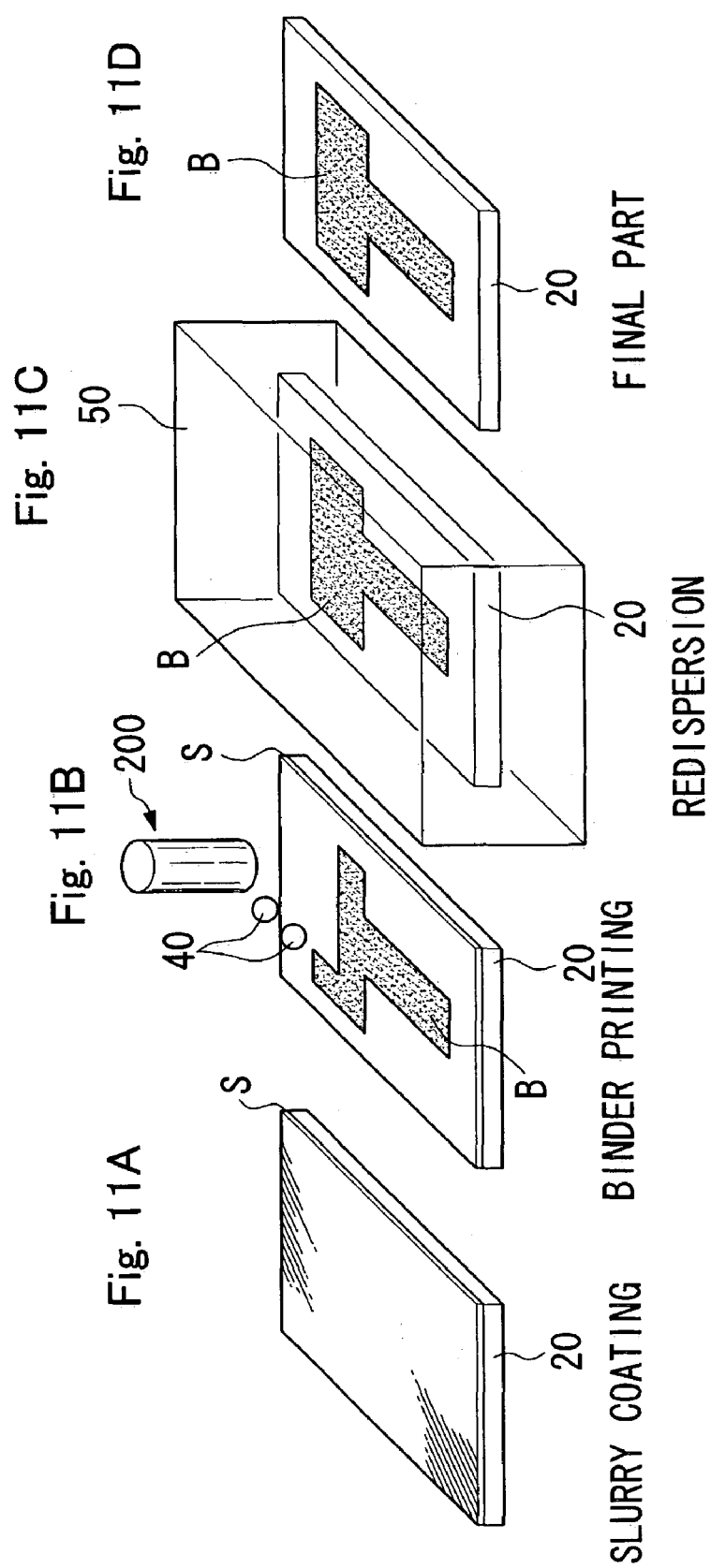

Electrode pattern

Cross section of silver

METAL SLURRY FOR ELECTRODE FORMATION AND PRODUCTION METHOD OF THE SAME

BACKGROUND

The present inventions relate to a slurry for use in electrode formation and a production method thereof, and more specifically, a metal slurry for electrode formation wherein a spherical metal powder is used and which slurry is excellent in dispersion property.

Conventionally, as a method for electrode formation on electronic components, "screen printing method for thick-film electrode formation" has been widely used in which a high viscosity paste for electrode formation is prepared and printed on the electronic components through a screen. In the screen printing method, the electrode pattern is determined by the screen pattern, and accordingly different electrode patterns require respectively different screen patterns prepared. Consequently, the conventional screen printing method involves the problems that it is not only unfavorable in cost but also difficult to meet quickly the electrode patterns changing with the design innovation in electronic components.

For the purpose of solving the above mentioned problems, nowadays, there has been developed such an electrode forming method that uses "jet printing technique" (hereinafter, the printhead used in the jet printing technique will be referred to as "jet printhead"). A method and apparatus for such jet printing is disclosed in allowed, co-assigned, U.S. patent application, U.S. Ser. No. 09/445,670, entitled JETTING LAYERS OF POWDER AND THE FORMATION OF FINE POWDER BEDS THEREBY, in the names of inventors Emanuel M. Sachs et al., 35 U.S.C. 102(e) date Mar. 1, 2000, which was the U.S. National Phase of PCT/US98/12280, filed Jun. 12, 1998, and published on Dec. 17, 1998, the full disclosure of which is hereby fully incorporated by reference herein. In this method, the slurry for use in electrode formation (hereinafter, referred to as "metal slurry for electrode formation" or simply "slurry" as the case may be) is prepared, which slurry is printed on a substrate by use of the jet printhead. The nozzle arranged in the jet printhead is as small as 10 to 130 μm in diameter, and hence there cannot be used such a high viscosity slurry that causes nozzle clogging. Accordingly, the metal particle sizes in the slurry are made small for the purpose of regulating the slurry viscosity. Incidentally, in the present specification, a powder means an ensemble of particles; the term "powder" will be used for the case where the material concerned is judged to be suitably referred to as powder in view of its nature as an ensemble of particles, while the term "particle" will be used for the case where the material concerned is judged to be suitably referred to as particle in view of its nature as the units constituting the powder. Since the powder and the particle share the common constituent unit, sometimes there may be, needless to say, no substantial difference between those matters which are meant by these two terms. In other words, sometimes either of the terms "powder" and "particle" can be used.

SUMMARY

In order to stably disperse metal particles in a slurry, it is necessary to make the metal particles sediment as slowly as possible. For that purpose, it is useful to make the metal particles small in size. In contrast to ceramic particles and polymer particles, however, the metal particles have relatively small surface charges so that Hammaker constant is large. Accordingly, with decreasing particle size the particles tend more easily to coagulate, and with developing coagulation the sedimentation tends to proceed. In other words, there is a problem that a slurry containing small-sized metal particles is low in dispersion property.

For the purpose of obtaining high performance electrodes, it is very important to make the electrode film to be dense. The electrode film thickness is usually controlled by regulating the concentration of the metal slurry for electrode formation. When the slurry concentration is high, the metal particles tend to coagulate with each other, and hence the dispersion property becomes lower. It is extremely difficult to make a dense electrode film by using a slurry low in dispersion property. Consequently, there is a demand for such a slurry that has a high dispersion property and is capable of forming dense electrode films.

In view of the above described problems, nowadays, the preparation of slurries by using nano-sized metal particles (hereinafter referred to as "nanoparticle") is performed. This is based on the idea that such fine particles as nanoparticles are characterized with active Brownian movement, and the dispersion property is to be improved thereby. Nanoparticles are, however, high in surface energy, and hence coagulate before being dispersed in dispersion medium. For preventing this coagulation, it is necessary to disperse nanoparticles in an organic solvent for the purpose of modifying the surfaces of nanoparticles. In consideration of the environment and adverse effect on human bodies, and so on, the use of organic solvents is not desirable.

Accordingly, the present inventions have an object to provide a metal slurry for electrode formation which slurry is high in dispersion property and capable of forming dense electrode films. In addition, the present inventions have another object to provide a method for producing such a slurry at a low cost and by a simple technique.

The present inventor made various investigations to obtain, by a reliable, uncomplicated technique, a slurry which is high in dispersion property and capable of forming dense electrode films. Consequently, it has been found that the density of the metal powder as observed subsequently to the slurry coating (hereinafter referred to as "sediment density") can be increased by using a spherical metal powder. In addition, it has been found that a metal slurry for electrode formation can be obtained which is capable of being coated through a nozzle and is high in dispersion property, without using expensive nanoparticles, but by making the mean particle size of the spherical metal powder fall within the range from 0.1 to 2.0 μm. In other words, the present inventions provide a metal slurry for electrode formation which slurry comprises a spherical metal powder having the mean particle size of 0.1 to 2.0 μm and a dispersion medium in which the metal powder is dispersed.

As described above, when nanoparticles are used, an organic solvent is needed as the dispersion medium, but there can be used water or lower molecular weight alcohols as the dispersion medium in the present invention wherein the metal powder of the order of microns (or submicrons) in particle size is used. By using water or lower molecular weight alcohols as the dispersion medium, it is possible to obtain a low-toxicity slurry for use in electrode formation.

Thus, the higher is the sediment density of a metal slurry for electrode formation, the denser electrode film is formed, and hence it becomes eventually possible to obtain a high performance electrode. The sediment density of a metal slurry for electrode formation is associated with not only the shape of the metal powder but also the tap density of the metal powder. When the metal powder (spherical powder) used is, for example, a silver powder, it is possible to obtain a metal slurry for electrode formation which is 50% or above in sediment density, by using the silver powder whose tap density be 3.0 g/cc or above. In general, the tap density of a metal powder depends on the chemical composition, particle size, and particle shape thereof, and it is significantly effective-to specify the particle size and the like of the metal powder in such a way that the sediment density of the metal slurry for electrode formation becomes 50% or above.

Furthermore, for metal slurry for electrode formation of the present invention, it is also possible to improve the dispersion property by adding a dispersant of 10 wt % or below (exclusive of zero) in relation to the metal powder.

In addition, the present inventions provide a production method of a metal slurry for electrode formation which slurry is composed of a mixture comprising a dispersion medium and a spherical metal powder and which method is characterized in that a metal powder of 0.1 to 2.0 µm in mean particle size is prepared, and the metal powder and a dispersion medium are mixed together. Ultrasonic vibration is preferably involved in mixing the metal powder and the dispersion medium with each other, and thereby there can be obtained a metal slurry for electrode formation excellent in dispersion property. According to need, a dispersant may be added. There is no particular limitation on the appropriate time for the addition of the dispersant as exemplified as follows: either the dispersant is added beforehand to the dispersion medium and subsequently a metal powder may be added to the mixture of the dispersion medium and dispersant; or the dispersion medium and a metal powder are mixed together to prepare a mixture, and subsequently the dispersant may be added to the mixture.

Furthermore, the present inventions provide a metal slurry for electrode formation which contains a spherical metal powder of 0.7 to 1.0 in sphericity and water as the dispersion medium wherein the metal powder is dispersed. With water as the dispersion medium, it is possible to obtain a metal slurry for electrode formation which is low both in toxicity and in cost. As a metal powder in the present inventions, there can be preferably used, for example, a metal powder produced by a reduction method.

BRIEF DESCRIPTION OF THE DRAWINGS

FIG. 1 is the table which shows the kinds of the metal powders used in Example 1 and the sediment densities of the metal slurries for electrode formation which used these metal powders;

FIG. 8A shows the relationship between the jet velocity of a metal slurry for electrode formation and the line width;

FIG. 8B shows the line shape variation associated with the jet velocity variation of the metal slurry for electrode formation used for FIG. 8A;

FIG. 9A shows an example of the conductor pattern;

FIG. 9B shows the cross sectional views of a conductor;

FIG. 11A schematically illustrates a slurry coating step in the manufacturing processes of an external electrode by use of a drop-on-demand type printhead;

FIG. 11B schematically illustrates a binder printing step in the manufacturing processes of an external electrode by use of a drop-on-demand type printhead;

FIG. 11C schematically illustrates a redispersion step in the manufacturing processes of an external electrode by use of a drop-on-demand type printhead;

FIG. 11D schematically illustrates a final part made by the manufacturing processes of an external electrode by use of a drop-on-demand type printhead;

DETAILED DESCRIPTION

Figure 2:
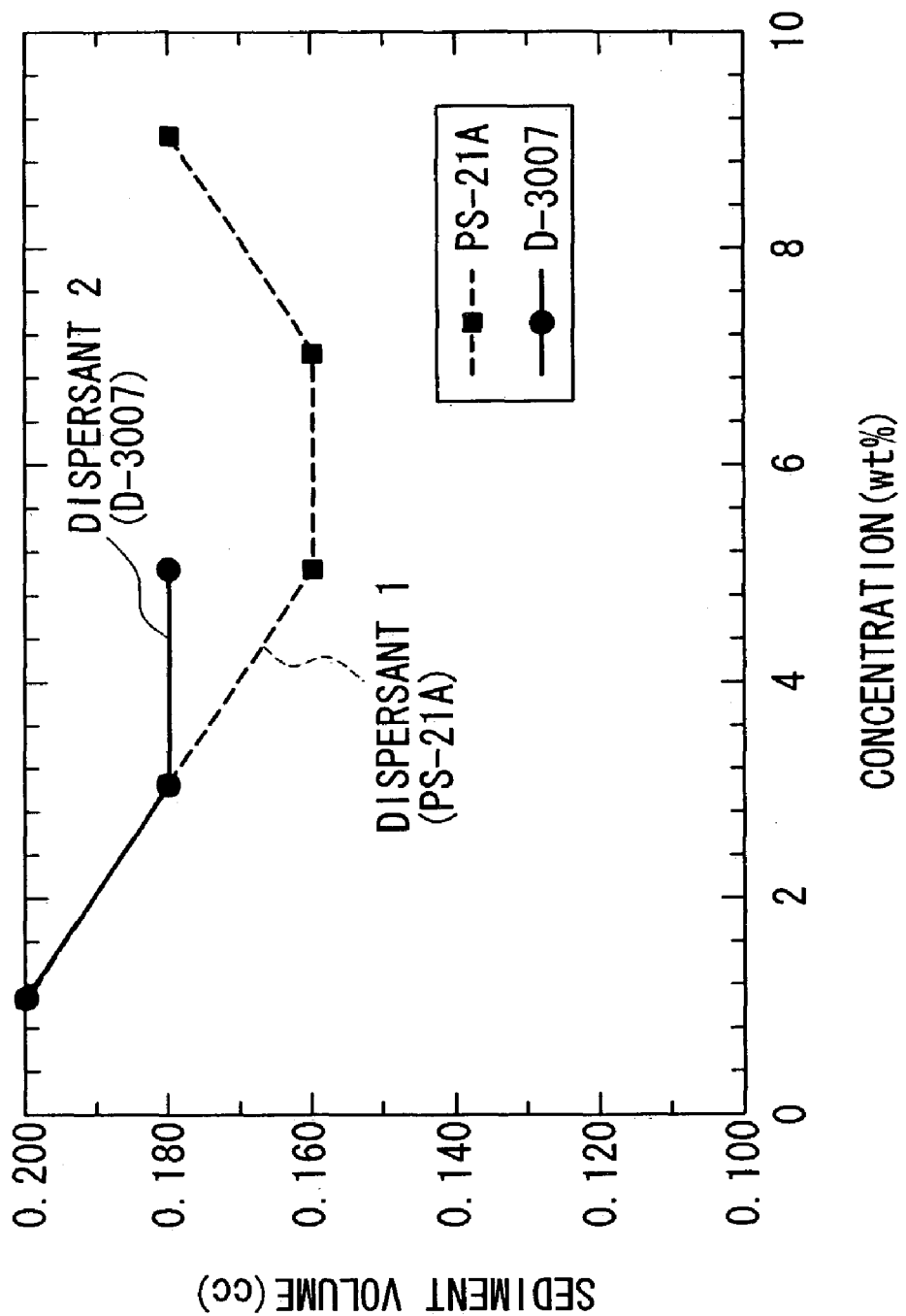
FIG. 2 is a graph showing the relationships between the addition amount of a dispersant (concentration) and the sediment volume of a metal slurry for electrode formation.

The present inventions relate to a metal slurry for electrode formation and is characterized in that a spherical metal powder is dispersed in a dispersion medium.

As the metal powder, such conductive materials well known in the art as gold, silver, copper, platinum, nickel, tungsten, chrome, aluminum, can be used. Among these materials, silver is preferable since it is excellent in conductivity and low in cost, and permits low temperature firing and firing in the air. These conductive materials can be used either each alone or as alloys thereof.

The mean particle size of the metal powder is specified to be 0.1 to 2.0 µm. When the mean particle size of the metal powder is 0.1 µm or above, the coagulation of the metal particles having the large Hammaker constants can be prevented. On the other hand, when the mean particle size of the metal powder exceeds 2.0 µm, the sedimentation rate of the metal powder increases and the dispersion property of the slurry is degraded. In a present embodiment, the metal slurry for electrode formation is printed on a substrate by use of the nozzle of a jet printhead, as detailed later. Accordingly, it is not preferable to use such a metal powder that is so high in sedimentation rate that the dispersion property is degraded before the slurry is jetted out from the nozzle. When the mean particle size of the metal powder exceeds 2.0 µm, the nozzle tends to be easily clogged. Thus, the mean particle size of the metal powder is specified to be 0.1 to 2.0 µm. The mean particle size of the metal powder is preferably 0.3 to 2.0 µm, and more preferably 0.5 to 1.5 µm.

The metal powders in the present invention are spherical in shape, which is a prominent feature. The spherical shape makes it possible for the metal slurry to have the sediment density of 50% or above. As described above, the performance of an electrode depends largely on the density of the formed electrode. The sediment density and the density of the formed electrode are proportional to each other, in such a way that the sediment density as high as 50% or above leads to formation of an electrode having high density.

Incidentally, in the present invention, a "spherical" powder signifies that the powder is 0.7 to 1 in sphericity.

It is preferable that the tap density of a metal powder is preferably 3.0 g/cc or above. As described above, the tap density varies depending on the chemical composition, size, shape, and the like of the metal powder. However, with a metal powder of 0.7 to 1 in sphericity and its tap density is 3.0 g/cc or above, there can be obtained a metal slurry for electrode formation whose sediment density can be as high as 50% or above. The preferred tap density depends on the individual metal powders; for the silver powder, the tap density is preferably 3.0 to 6.0 g/cc, and more preferably 3.5 to 6.0 g/cc.

As for the above described metal powder, a metal powder is preferably prepared by means of a chemical synthetic method such as the coprecipitation method. Specifically, for example, it is possible to produce the above mentioned spherical metal powder by reducing a starting raw metal material in an aqueous medium.

The above described dispersion medium of the metal powder is selected from water and lower molecular weight alcohols, and among them water is particularly preferable. When an organic solvent is used as a dispersion medium as in the prior art, the slurry becomes high in toxicity and possibly gives adverse effects to human bodies and the environment. On the other hand, when water or a lower molecular weight alcohol is used, a slurry small in adverse effects to human bodies and the like, that is, low in toxicity can be obtained.

As the water for the dispersion medium, a purified water having a high purity is preferable, but it may contain small quantities of impurities such as nitrogen, silicon. As a lower molecular weight alcohol, methanol, ethanol, propanol, butanol, isopropyl alcohol (isopropanol), and the like can be used.

The choice of the dispersion medium between water and the lower molecular weight alcohols is properly made according to the kinds of the metal powder, dispersant, and the like. Specifically, it is preferable to use water as the dispersion medium for the purpose of improving the dispersion property by adding a dispersant.

Incidentally, it is possible to use as the dispersion medium a mixed solvent composed of water and a lower molecular weight alcohol.

Now, description is made of the dispersant.

As a dispersant, a dispersant well known in the art such as a phosphoric ester can be used as the case may be. The addition amount of a dispersant is specified to be 10 wt % or below (exclusive of zero) in relation to the amount of the metal powder. The addition amount is more preferably 8 wt % or below, and further more preferably 6 wt % or below. The effect of an added dispersant in improving the dispersion property is dependent on the kinds of the dispersant, and generally becomes remarkable around the addition amount of 5 wt %.

A dispersant is not beneficial as an electrode component, so that it is preferable, from the performance and durability of the electrode, that the dispersant barely persists after firing the slurry. The addition amount of a dispersant is, in the present invention, as small as 10 wt % or below in relation to the amount of the metal powder. Therefore, when the slurry is fired, the remaining dispersant is thermally decomposed almost completely so that the dispersant component barely persists in the finally obtained electrode.

The addition of a dispersant is optional, and a metal slurry for electrode formation having a high dispersion property can be sometimes obtained without addition of a dispersant, depending on the chemical composition, size, shape, and the like of the metal powder.

The variation of the hydrogen ion exponent (hereinafter referred to as "pH") in a metal slurry for electrode formation can also improve the dispersion property of the slurry, either with or without addition of a dispersant. This is because the surface charges on the metal particles are altered by the pH variation.

In the present invention, a metal slurry for electrode formation is produced by mixing a spherical metal powder and a dispersion medium, both described above.

The ratio of the metal powder content to the dispersion medium content (volume ratio) is preferably of the order of 1:99 to 40:60. The preferred viscosity of a metal slurry for electrode formation is dependent on the coating method. For the purpose of coating a metal slurry for electrode formation by use of a jet printhead, there can be obtained a metal slurry for electrode formation which provides a stable jet velocity from the nozzle through specifying the ratio of the metal powder content to the dispersion medium content to be 1:99 to 40:60.

The viscosity of a metal slurry for electrode formation is preferably 20 cps or below, more preferably 15 cps or below, and further more preferably 5 to 15 cps.

The preferred viscosity of a metal slurry for electrode formation is varied depending on the nozzle diameter. Accordingly, even when the viscosity falls outside the above described range, a satisfactory jetting out of the slurry is possible by properly choosing the nozzle diameter.

The contents of a metal powder and a dispersion medium are determined according to the respective ranges described above, and then the metal powder and the dispersion medium are mixed together. The mixing process is performed with a machine involves an ultrasonic vibration, for example, a homogenizer. Thereby a metal slurry for electrode formation, which is homogeneously dispersed, can be obtained.

The mixing time is specified to be of the order of 1 min 30 sec to 10 min. When the mixing time is shorter than 1 min 30 sec, sufficient dispersion is not attained. On the other hand, when the mixing time is longer than 10 min, the metal slurry for electrode formation liberates much heat and a part of the dispersion medium is evaporated. Accordingly, the mixing time is determined to be 1 min 30 sec to 10 min. The mixing time is preferably 1 min 30 sec to 5 min, and more preferably of 1 min 30 sec to 3. The preferable mixing time is varied depending on the power of the homogenizer.

As described above, there is no particular limitation to the timing for addition of a dispersant. The addition and mixing of a dispersant can be performed according to the following:

(1) Simultaneous addition of a dispersant and a metal powder to a dispersion medium followed by mixing;

(2) Addition of a dispersant to a dispersion medium followed by an optional mixing followed by addition of a metal powder followed by mixing; and (3) Addition of a metal powder to a dispersion medium followed by an optional mixing followed by addition of a dispersant followed by mixing.

As detailed above, according to the production method of metal slurry for electrode formation in the present embodiment, a slurry high in dispersion property can be obtained in a reliable way. When a metal slurry for electrode formation related to the present embodiment is used, there can be obtained a high performance electrode which has a dense electrode film. In the present embodiment, a metal powder having a particle size of the order of microns or submicrons is used, and hence there scarcely occurs such coagulation of metal particles as seen when nanoparticles are used. Metal powders of the order of microns or submicrons in particle size are lower in price than nanoparticles, and hence the required cost for producing an electrode can be reduced. The use of metal powders of the order of microns or submicrons in particle size makes it possible to use water or lower molecular weight alcohols as dispersion medium, which can produce a metal slurry for electrode formation low in toxicity.

A metal slurry for electrode formation of the present inventions is coated onto an electrode substrate and fired to produce an electrode. When the slurry is coated on the electrode substrate, the jet printing technique, for example, can be used. The coating method specific to the jet printing technique will be described later with reference to examples.

EXAMPLES

Further detailed description will be made below on the present inventions with reference to specific examples.

Example 1

Description is made below of Example 1 which was performed as an experiment for examination of the relation between the shape of a metal powder and the sediment density of a metal slurry for electrode formation.

FIG. 1 shows 9 kinds of metal powders prepared for the experiment. Each metal powder was added to water (dispersion medium) and mixed together by use of a homogenizer, and 9 different kinds of metal slurries for electrode formation (Samples No. 1 to No. 9) were produced. The sediment densities of these metal slurries for electrode formation thus obtained were measured, and the results are also shown in FIG. 1. The mixing operation with a homogenizer was performed in such a manner that several cycles of dispersing for 15 seconds and subsequent allowing to stand for 15 seconds (cooling) were performed. The ratio of the metal powder to water (volume ratio) was 10:90 for any sample.

As can be seen from FIG. 1, the sediment densities for Samples No. 5 to No. 9, wherein spherical powders were used, are higher than those for Samples No. 1 to No. 4 wherein pulverized powders of irregular shapes were used. To be specific, the sediment densities of Samples No. 1 to No. 4 are 22.2 to 41.7%, whereas the sediment densities of Samples No. 5 to No. 9, for which spherical powders were used, are 55.6 to 62.5%, all being 50% or above. In other words, it can be said that the use of a spherical powder is effective in obtaining a metal slurry for electrode formation having a high sediment density of 50% or above.

As FIG. 1 shows, all the samples with the tap density of 3.0 g/cc or above have a sediment density of 50% or above. Thus, it has been found that the tap density is an important factor and it is effective to use a powder with the tap density of 3.0 g/cc or above for the purpose of obtaining a high sediment density of 50% or above. Samples No. 5 to No. 7 having the tap density of 3.2 to 4.3 g/cc show higher sediment densities than Samples No. 8 and No. 9, both having the tap density of 4.43 g/cc or above. Consequently, it can be said that when the silver powder is used as a metal powder, the preferable tap density is 3.0 to 4.4 g/cc.

As for the relationship between the mean particle size and the sediment density, any of spherical powder Samples No. 5 to No. 9 having the mean particle size of 2.0 µm or below shows a high sediment density. Here, the sediment densities of Samples, No. 5 to No. 7 having the mean particle size of 1.0 µm or below are all 62.5%, whereas the sediment densities of Samples No. 8 to No. 9 respectively having the mean particle sizes of 1.2 and 1.5 µm are 55.6%. Accordingly, it is inferred that the mean particle size is preferably 1.1 µm or below, and more preferably be 0.5 to 1.0 µm.

When Sample No. 1 (pulverized powder) and Sample No. 5 (spherical), both being 1.0 µm in mean particle size are compared, it is pointed out that the sediment density of Sample No. 1 (pulverized powder) is 32.3%, whereas the sediment density of Sample No. 5 is a high value of 62.5%. Accordingly, it is the powder shape rather than the mean particle size that has a significant effect on the sediment density, and it is preferable that the powder shape is spherical and the mean particle size is 2.0 µm or below.

Example 2

Description is made below of Example 2 which was performed as an experiment for examination of the dispersant addition effects. It is difficult to numerically indicate the dispersion property, and hence the improvement in dispersion property was judged from the recognized reduction of the sediment volume. Here, the sediment volume means the volume of the sedimentary metal powder. The sediment volume was obtained as follows: a slurry was charged into a glass tube having a predetermined length and allowed to stand for 3 days, and then the volume of the sedimentary metal powder was measured.

Sample No. 8 prepared in Example 1 was added with the following two different kinds of dispersants. FIG. 2 shows the sediment volume variation of the slurry associated with the variation in dispersant addition amount.

Dispersants

Dispersant 1: PS-21A (phosphoric ester) manufactured by Witco Corporation (a division of Crompton Corporation, Middlebury, Conn.).

Dispersant 2: Duramax D-3007 (sodium polyacrylate) manufactured by Rohm and Haas Company (of Philadelphia, Pa.).

As FIG. 2 shows that the sediment volume was decreased by adding Dispersant 1, and the addition of Dispersant 1 (phosphoric ester) can be said to be effective in improving the dispersion property. In particular, when the addition amount exceeded 7 wt %, the sediment volume was gradually increased and when the addition amount reached 9 wt %, the sediment volume became the same as that found for the addition amount of 3 wt %. Thus, it has found that the effective addition amount of Dispersant 1 is 7 wt % or below.

The sediment volume was decreased with increasing addition amount of Dispersant 2 when the addition amount was 1 to 3 wt %, but the sediment volume was not altered by increasing the addition amount above 3 wt %. Accordingly, the addition amount of Dispersant 2 is preferably 3 wt % or below.

As described above, it has been found that the addition of a dispersant within the predescribed range decreases the sediment volume, that is, improves the dispersion property. The preferable addition amount of a dispersant is varied by the kind of the metal powder contained in a metal slurry for electrode formation, and it is inferred that the effective addition amount of a dispersant is 10 wt % or below.

Sample No. 7 showed a sufficiently high dispersion property without adding a dispersant. Thus, the addition of a dispersant to a metal slurry for electrode formation is not indispensable, and the addition amount of a dispersant can be properly adjusted according to the kind of the metal powder contained.

Example 3

Description is made below of Example 3 which was performed as an experiment for examination of the sedimentation behavior of a metal slurry for electrode formation when a dispersant was added.

Figure 3:
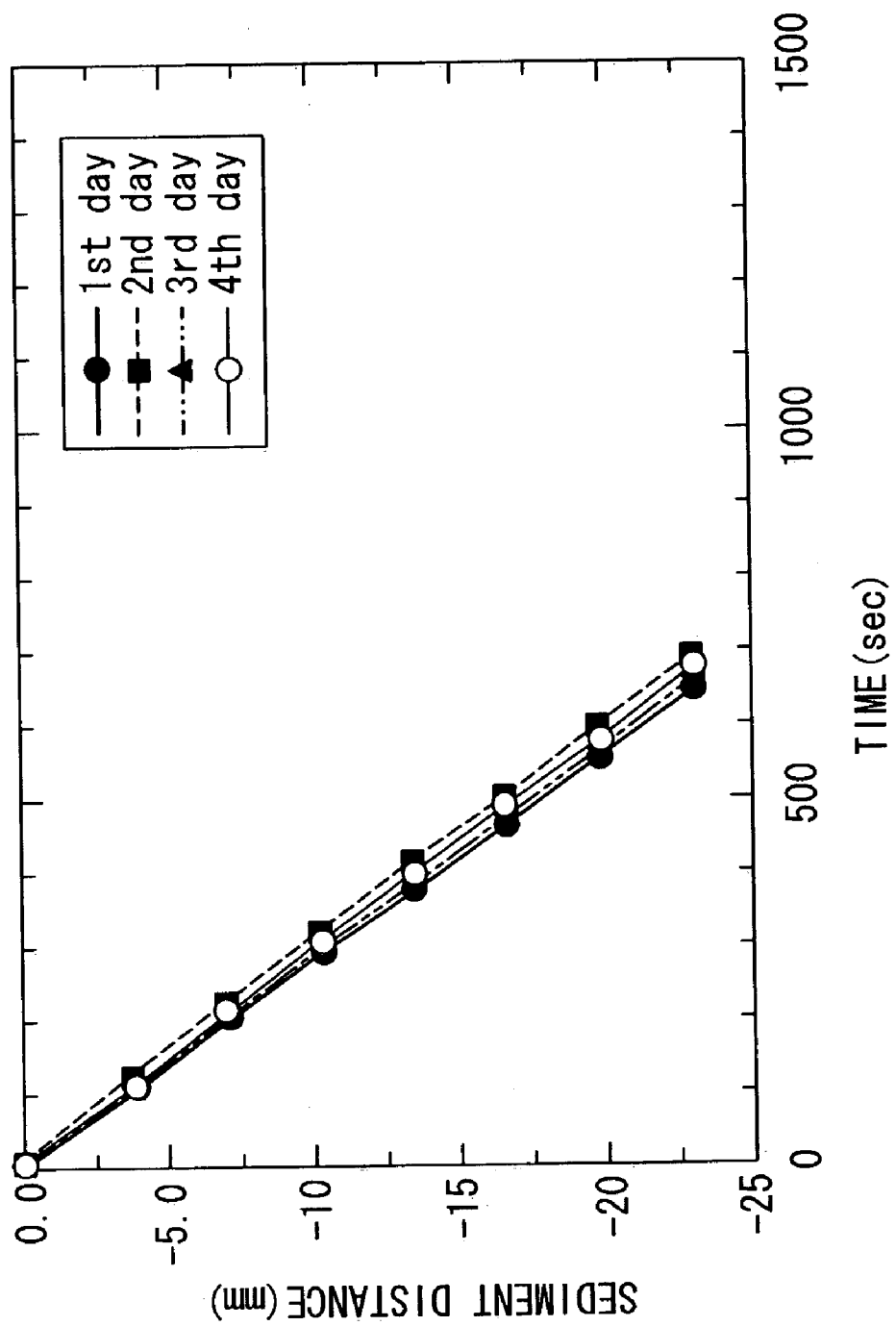
FIG. 3 is a graph showing the sedimentation behavior of a metal slurry for electrode formation when a dispersant was added.

Dispersant 1 described above was added to the slurry of Sample No. 7 prepared in Example 1. The metal slurry for electrode formation added with the dispersant was charged into a glass tube and allowed to stand, and the time required for the metal powder in the slurry to make a sedimentation of 23 mm was measured. The same measurement was performed repeatedly over 4 days on the same slurry, and the results obtained are shown in FIG. 3. In FIG. 3, the straight line denoted by "1st day" shows the sedimentation behavior of the slurry for the fist day. Similarly the straight lines denoted by "2nd day","3rd day", and "4th day" show respectively the sedimentation behaviors for the second, third, and fourth day. In order to make the measurement conditions be the same over the four days, the metal slurry for electrode formation was well dispersed before the experiment of each day and then the experiment was performed. The addition amount of Dispersant 1 was five wt % in relation to the metal powder.

As FIG. 3 shows, when Dispersant 1 was added, the sedimentation behavior was hardly varied over the four days. In other words, it took 700 seconds for the metal powder to make a sedimentation of 23 mm on the first day, and the same sedimentation behavior was observed on the fourth day.

Figure 4:
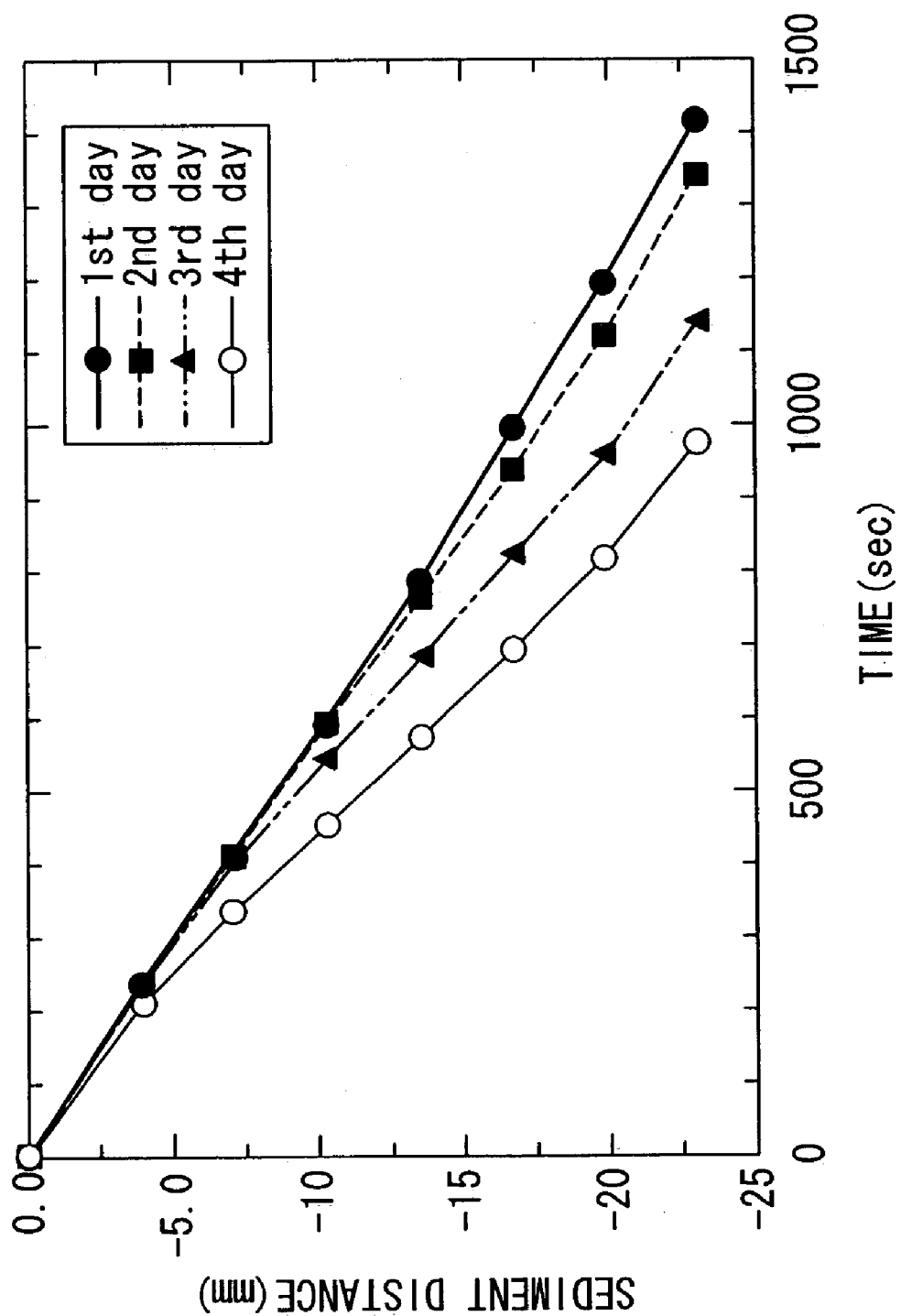
FIG. 4 is a graph showing the sedimentation behavior of a metal slurry for electrode formation when no dispersant was added.

FIG. 4 shows the sedimentation behavior of a slurry observed when no dispersant was added. It was the slurry of Sample No. 7 prepared in Example 1 similarly to the above case, and the observation conditions for the sedimentation behavior were the same as those for the above described case.

As can be seen from FIG. 4, when no dispersant was added, the variation per day of the sedimentation behavior of the metal slurry for electrode formation, that is, the variation per day in sedimentation rate became larger. More specifically, the time required for sedimentation became shorter in the order of the first day to the fourth day. On the first day it took about 1400 seconds for the metal powder to make a sedimentation of 23 mm, while on the fourth day it took about 1000 seconds for the same sediment distance. In the present specification, the sediment distance means the distance between the liquid surface and the sediment interface.

From the results described above, it has been found that when a dispersant is added, the sedimentation rate of the metal powder in a slurry can maintain nearly the same value even after the elapse of several days since the slurry was prepared. This suggests that when. a slurry high in dispersion property is prepared, such a dispersion property can be maintained for a certain period of time. Thus, it can be said that the addition of a dispersant is effective for storing a metal slurry for electrode formation in a stable condition. Accordingly, even for a slurry exhibiting a high dispersion property without being added with a dispersant such as, for example, Sample No. 7, it is effective to add a dispersant for the purpose of acquiring the stability of the slurry. In the present Example, the sedimentation behavior of a metal slurry for electrode formation was observed over 4 days; in consideration of the observed results, it is inferred that the stability of a slurry is maintained for about a month when a dispersant is added.

Example 4

Description is made below of Example 4 which was performed as an experiment for examination of the effect of a dispersant when water or a lower molecular weight alcohol was used as the dispersion medium. Similarly to the case of Example 2, the improvement in dispersion property was judged by the recognized reduction of the sediment volume of a metal slurry for electrode formation.

Figure 5:
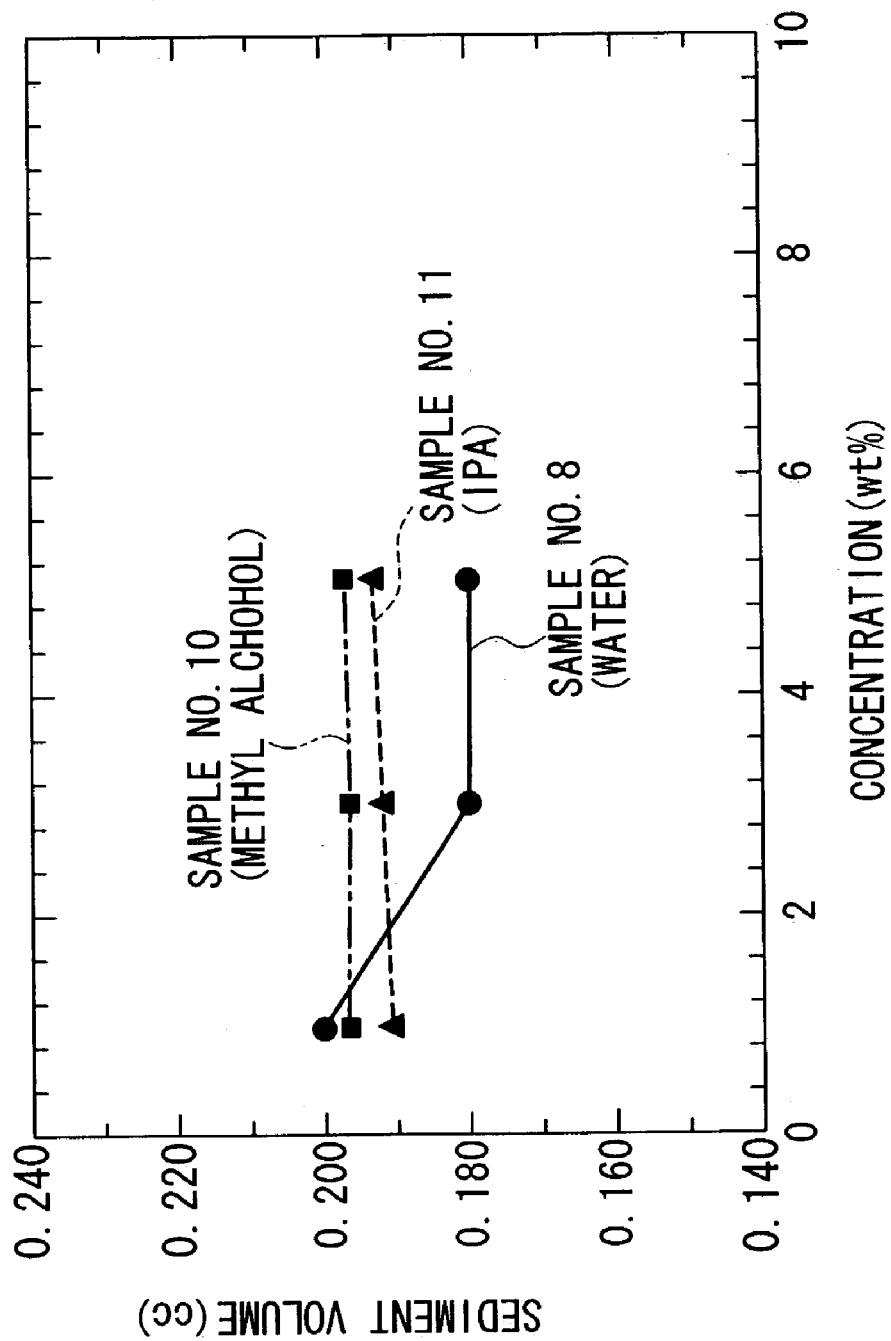
FIG. 5 is a graph showing the sediment volumes of metal slurries for electrode formation where the dispersion medium used was water or lower molecular weight alcohols.

Dispersant 2 described above was added to Sample No. 8 prepared in Example 1, and the sediment volume variation of the slurry was measured, associated with the variation in dispersant addition amount. The results obtained are shown in FIG. 5. In addition to the Sample No. 8 prepared in Example 1, Sample No. 10 and Sample No. 11 were prepared as follows. Dispersant 2 described above was also added to Sample No. 10 and Sample No. 11, and the sediment volumes were measured, associated with the variation in dispersant addition amount. The results obtained are also shown in FIG. 5.

Sample No. 10: The same metal powder as that in Sample No. 8 was dispersed in a methanol solution; the concentration of the methanol solution was 100%. The ratio of the metal powder to the methanol solution (volume ratio) was set to be 10:90.

Sample No. 11: The same metal powder as that in Sample No. 8 was dispersed in an isopropyl alcohol solution (IPA); the concentration of the isopropyl alcohol solution was 100%. The ratio of the metal powder to the isopropyl alcohol solution (volume ratio) was set to be 10:90.

As can be seen from FIG. 5, the sediment volumes were as low as 0.200 cc or below for all of Sample No. 8 with water as dispersion medium, Sample No. 10 with methanol as dispersion medium, and Sample No. 11 with isopropyl alcohol as dispersion medium. Accordingly, it has been found that the lower molecular weight alcohols are also effectively used as the dispersion mediums.

In Sample No. 10 (dispersion medium: a methanol solution) and Sample No. 11 (dispersion medium: an isopropyl alcohol solution), the sediment volumes were nearly constant even with increasing addition amount of the dispersant. On the other hand, in Sample No. 8 (dispersion medium: water), the sediment volume was about 0.200 cc when the addition amount of the dispersant was about 1 wt %, whereas the sediment volume was about 0.180 cc when the addition amount of the dispersant was about 3 wt %. To sum up, among Sample NO. 8, Sample No. 10, and Sample No. 11, Sample No. 8 showed the most prominent effect of the dispersant. Thus, it can be said that the use of water as dispersion medium is effective when a dispersant is added.

As for the sediment volumes around the dispersant addition amount of 1.0 wt %, Sample No. 11 (dispersion medium: an isopropyl alcohol solution) shows the lowest sediment volume. Thus, the use of isopropyl alcohol as dispersion medium is effective when the addition amount of the dispersant is small or no dispersant is added.

Example 5

Description is made below of Example 5 which was performed as an experiment for printing a metal slurry for electrode formation by use of the jet printing technique.

In the present Example, an internal electrode was fabricated by use of a continuous-jet printhead as a jet printhead. As detailed later, the continuous type printing is characterized in that the ink and the like (the metal slurry for electrode formation in the present embodiment) is always jetted out by air pressure. The continuous type printing is performed in such a way that a body to be printed (an electrode substrate in the present embodiment) is fixed in location and the printhead is driven to move. Accordingly, the moving speed of the printhead (head speed) can be considered as the printing speed.

In the present Example, a reason for the use of a continuous type printhead is as follows. In printing a metal slurry for electrode formation, if the jetting out of the slurry is stopped completely, sedimentation of the silver powder starts in any slurry residing in a reservoir, and hence variation in silver concentration invariably occurs even with a slurry prepared in a stable condition. On the contrary, the use of a continuous type printhead permits switching on and off the printing of a metal slurry for electrode formation while suppressing the sedimentation of the silver powder.

Now, a continuous jet printhead 100 is outlined which is schematically shown in FIG. 6. A slurry 10 is fed through a nozzle 1, and the slurry 10 extruded from the tip of the nozzle 1 forms spherical droplets owing to the surface tension thereof. The droplet formation becomes stable by oscillating the slurry 10 with a piezo-tube 5.

Figure 6A:
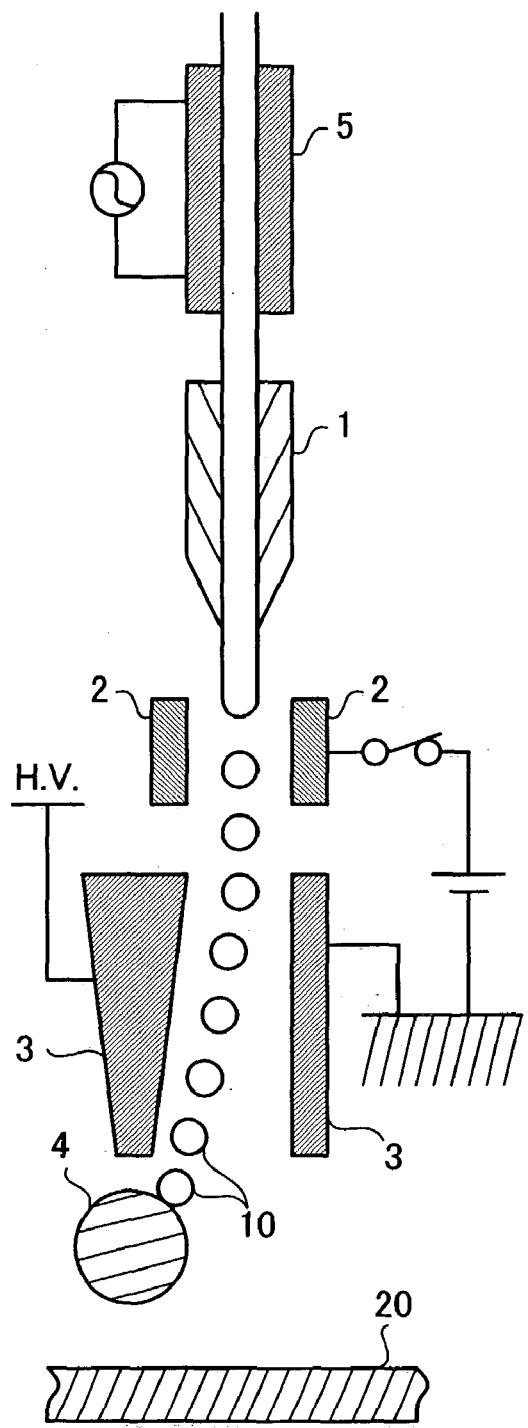
FIG. 6A schematically shows a continuous-jet printhead with droplets being deflected toward a catcher.

Near the nozzle 1, a charging cell 2 is arranged which works as an electrode. By applying a voltage to the charging cell 2, the droplets are charged electrically, and by applying a voltage to a deflection cell 3, arranged beneath the charging cell 2 as shown in FIG. 6A, the charged droplets are varied in traveling direction and collected on a catcher.4 working as a receiving vessel.

Figure 6B:
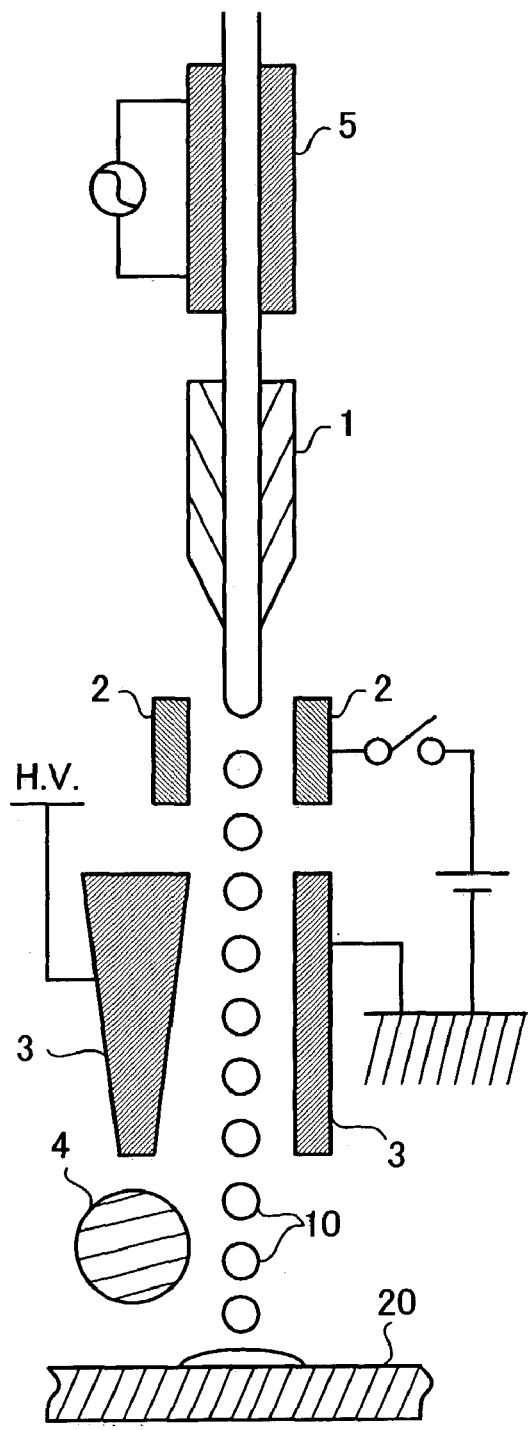
FIG. 6B schematically shows a continuous jet printhead as shown in FIG. 6A, with droplets hitting the target.

On the other hand, as FIG. 6B illustrates, when the droplets are not charged by the charging cell 2, the droplets travel straight and are printed on an electrode substrate 20.

Example 5-1

Description is made below of Example 5-1 which was performed as an experiment for examination of the line width variation when the jet velocity of the slurry 10 was varied. In the present Example, the examined metal slurry for electrode formation is the slurry of Sample No. 7 prepared in Example 1, and the electrode substrate is an aluminum substrate.

When the jet velocity of the slurry 10 was varied to be 3.90 m/s, 4.88 m/s, 5.95 m/s, 6.90 m/s, and 7.64 m/s, the line widths printed on the electrode substrate 20 were measured, and the results obtained are shown in FIG. 7. The head speed of the continuous jet printhead 100 was set at the three steps of 100 cm/s, 125 cm/s, and 150 cm/s, for each step the line width being measured. The nozzle used 1 had a diameter of 70 μm.

Figure 7A:
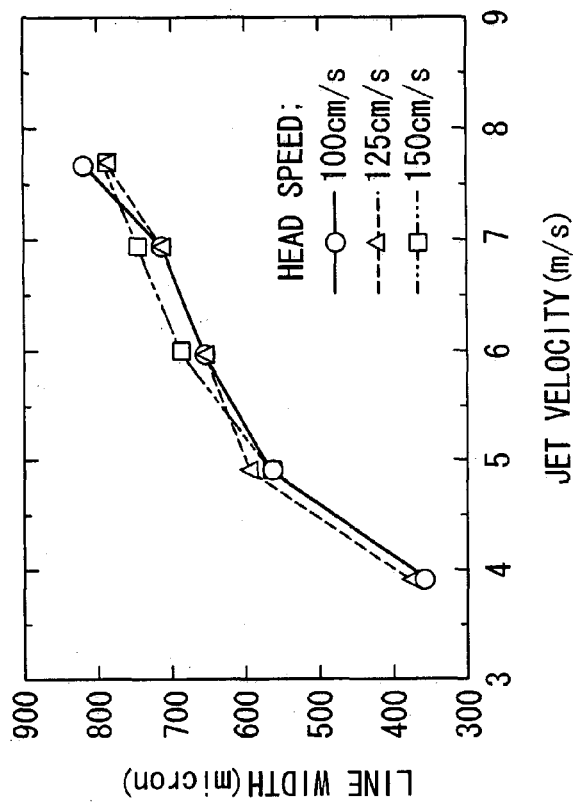
FIG. 7A shows the relationships between the jet velocity of a metal slurry for electrode formation and the line width.
Figure 7B:
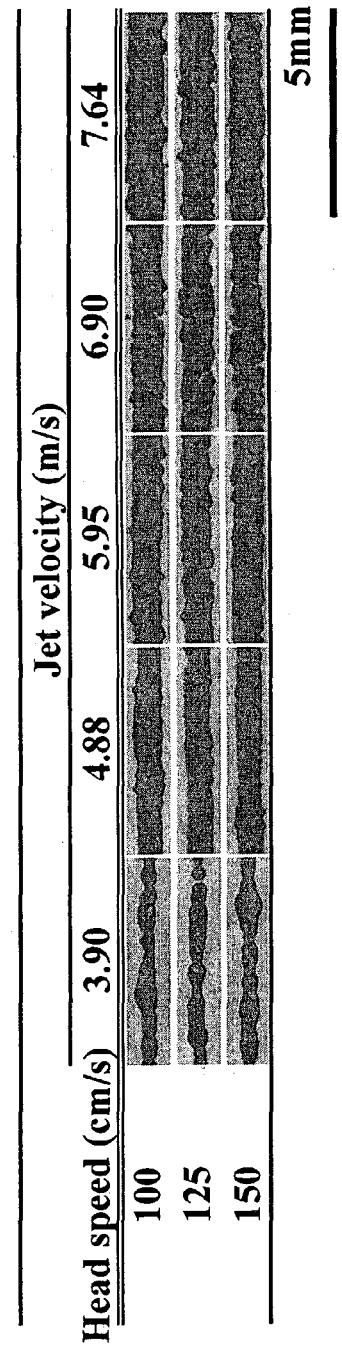
FIG. 7B shows the line shape variations associated with the jet velocity variation of the metal slurry for electrode formation used for FIG. 7A.

FIG. 7A shows the relationships between the jet velocity of the slurry 10 and the line width, while FIG. 7B shows the line shape variation following the jet velocity variation of the slurry 10.

As FIGS. 7A and 7B show, the line width became broader with increasing jet velocity of the slurry 10. This is because with increasing jet velocity the impact of a droplet striking the electrode substrate 20 became large and accordingly the droplet was crushed to form an enlarged shape. Thus, it has been found that the electrode pattern having an arbitrary line width can be obtained by adjusting the jet velocity of the slurry 10 according to the desired line width. When the jet velocity is as slow as 3.90 m/s, the jetting out is not stabilized, and hence it is preferable to set the jet velocity at 4.5 m/s or above when the nozzle diameter is 70 μm.

As FIG. 7B shows, in case of the head speed of 125 cm/s or 150 cm/s, the line width began to be disturbed with the jet velocity increased to 6.90 m/s, and hence it is necessary to adjust the jet velocity according to the head speed.

From the results presented above, it has been confirmed that it is effective to set the jet velocity to be on the order of 4.5 to 6.5 m/s in order to draw a line uniform in line width when the nozzle diameter is 70 μm.

Example 5-2

Now, the line width variation following the jet velocity variation of the slurry 10 was examined by use of a nozzle 1 of 45 μm in diameter, and the results obtained are shown in FIG. 8. FIG. 8A shows the relationship between the jet velocity of the slurry 10 and the line width, while FIG. 8B shows the line shape variation following the jet velocity variation of the slurry 10. Incidentally, the head speed of the continuous jet printhead 100 was set to be 150 cm/s.

As FIGS. 8A and 8B show, with increasing jet velocity of the slurry 10, the width of the line drawn was increased. When the jet velocity was 4.76 m/s or 5.42 m/s, as FIG. 8B shows, a thin and uniform line could be drawn, but the slurry 10 was hardly fed stably with such a low jet velocity. When the jet velocity was 6.48 m/s, a thick and uniform line could be drawn, and the slurry 10 was stably jetted out. When the jet velocity was 7.30 m/s or above, however, there occurred such inconvenience that the slurry 10 was splashed; the slurry 10 was splashed to portions other than the portion where the electrode pattern was desired to be formed.

Thus, it has been found that the preferable jet velocity is 6 to 7 m/s when the nozzle diameter is 45 μm. By specifying the jet velocity to fall within this range, a uniform line can be stably drawn while preventing the slurry 10 from being splashed.

As described above, it has been found in Example 5 that the width of the printed line (the electrode width) is determined by the diameter of the nozzle 1, the jet velocity of the slurry 10, and the head speed of the continuous jet printhead 100. It has also been confirmed that by properly varying these factors, an arbitrary electrode pattern can be printed on the electrode substrate 20. As an example of the conductor patterns fabricated in Example 5, a plan digital image of a conductor pattern is shown in FIG. 9A, from which an accurate electrode pattern formation is recognized.

FIG. 9B shows the sectional digital image of the conductor patterns formed in Example 5. The upper row of FIG. 9B shows the sectional images of the green bodies before the firing, while the bottom row of FIG. 9B shows the sectional images of the fired bodies. The digital images of the green bodies were taken after the processes of impregnating resins into the bodies, and then cutting and polishing the impregnated bodies.

As can be seen from the upper row of digital images in FIG. 9B, silver particles were uniformly dispersed and high density electrode films were formed in any of the cases where the metal slurry for electrode formation was coated onto the substrate respectively in one layer, three layers, and ten layers. When a metal slurry for electrode formation is low in dispersion property, a multilayer coating, for example, tends to have interlayer defects. In other words, the silver particle distribution in the upper portion of a layer and that in the bottom portion of the layer become different from each other, and hence the silver particle distribution becomes discontinuous when another similar layer is superposed on the layer. Such inconvenience has not been observed in the present Example. Accordingly, it can be said that the metal slurry for electrode formation of the present inventions is high in dispersion property, and suitable for the case of multilayer coating. As can be seen from the bottom row digital images of FIG. 9B, the uniform and high density electrode films were maintained even after the firing.

Example 6

Description is made below on Example 6 which was performed as another experiment for printing a metal slurry for electrode formation by use of the jet printing technique.

In the present Example, an external electrode was fabricated by use of a drop-on-demand (DoD) type printhead (hereinafter referred to as "DoD" type) as a jet printhead. As is detailed later, the DoD type printing is characterized in that printing is performed with ink or the like (a binder in the present Example) jetted out by air pressure, a heater, or the like according to data. The reason for the use of a DoD type printhead is as follows. The above described continuous jet printhead 100 has the two kinds of electrode cells (the charging cell 2 and the deflection cell 3) so that the distance between the tip of the nozzle 1 and the electrode substrate 20 is as long as about 25 mm, and hence has a drawback that the impact location of a droplet tends to be shifted from the desired location. Another drawback is that it is difficult to draw fine lines owing to the jet velocity being increased to such an extent that is required for enabling continuous jetting out. A DoD type printhead can circumvent these two drawbacks, and the DoD type printhead can draw fine electrode patterns more precisely. The DoD type printhead was used only for printing a binder, while the aforementioned continuous jet printhead 100 was used when coating a metal slurry for electrode formation onto the electrode substrate 20.

Figure 10A:
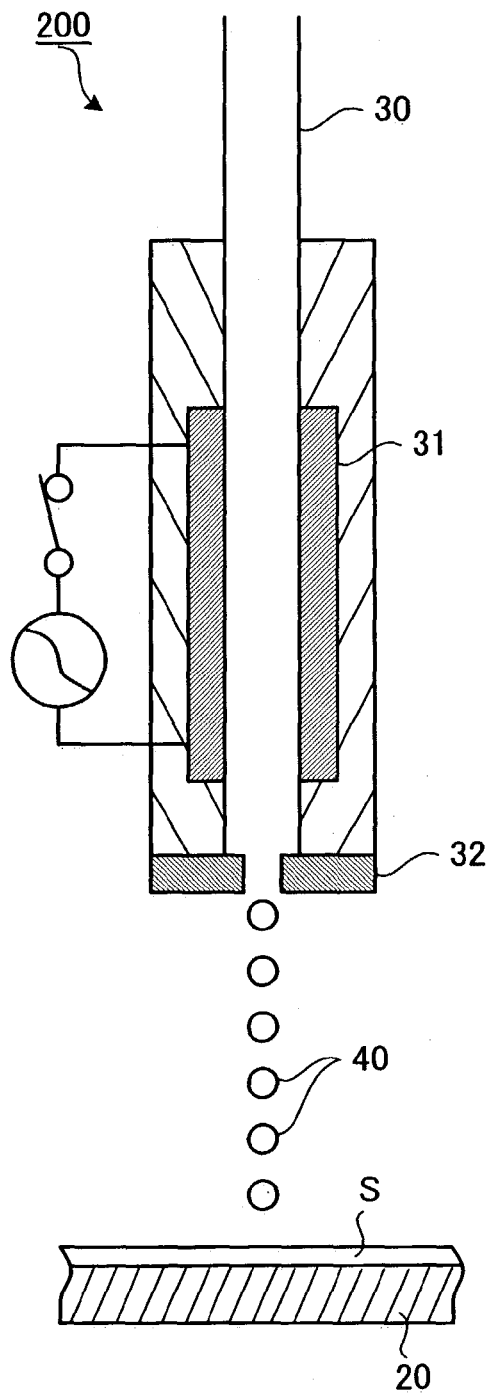
FIG. 10A schematically illustrates a drop-on-demand type printhead with droplets being ejected.
Figure 10B:
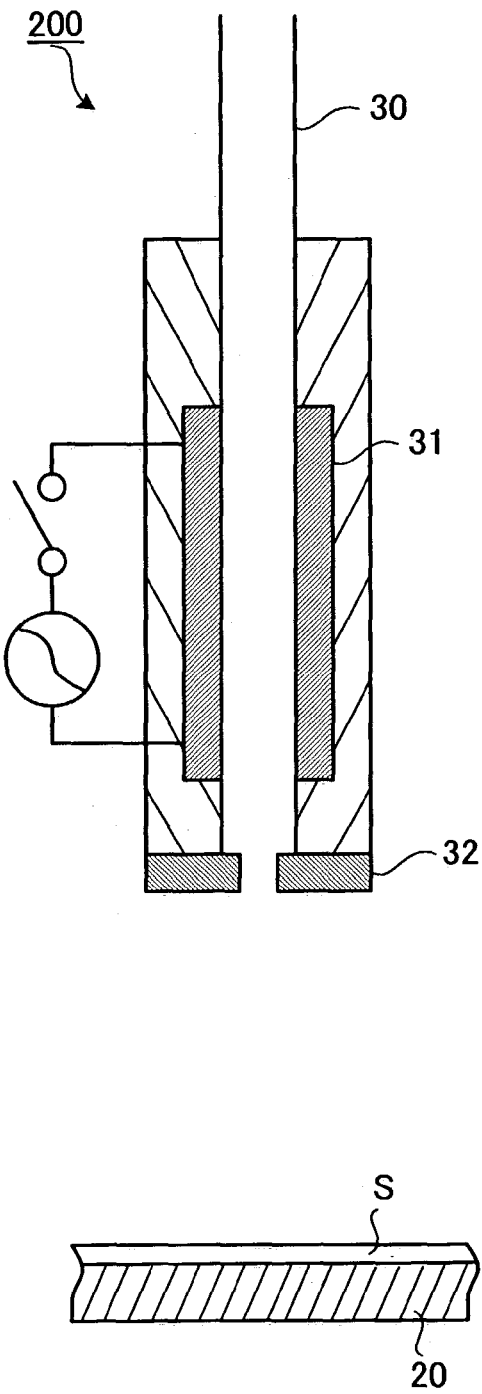
FIG. 10B schematically illustrates a drop-on-demand type printhead that is not ejecting any droplets.

Now, here is outlined a DoD type printhead 200 schematically illustrated in FIG. 10; FIG. 10A illustrates a state of printing being on, and FIG. 10B a state of printing being off.

The DoD type printhead 200 adopts the scheme in which one impressed signal drives a nozzle 30 to eject one droplet from the tip thereof through contraction of the piezo-tube 31. The droplet jet velocity can be made as very slow as 2 to 3 m/s. However, in the scheme of DoD printhead, the liquid flow is completely impeded when printing is off. Therefore, if this DoD printhead scheme is applied to the slurry 10, the nozzle 30 tends to be clogged owing to sedimentation of the metal powder. Thus, the DoD printhead is suitable for printing of homogeneous solutions such as a binder and the like rather than slurries. In the present Example, there was adopted a scheme in which the slurry 10 was coated all over the electrode substrate 20, then the binder 40 was printed in accordance with the desired electrode pattern, and the external electrode pattern was fabricated through subsequent thermal curing and redispersion. The redispersion is detailed later.

With reference to FIG. 11, description is made below of the manufacturing process of an electrode using the printhead 200. An aluminum substrate was prepared as the electrode substrate 20, and a polyacrylic acid solution of 5 volt% in concentration was prepared as the binder 40. An orifice plate 32 which had an orifice diameter of 50 μm was used.

First, as FIG. 11A shows, the slurry 10 was coated all over the top surface of the electrode substrate 20 to form a slurry layer S (powder bed). For the coating of the slurry 10, the above described continuous jet printhead 100 was used in the mode of printing being on at all times. The slurry 10 used is the slurry of Sample No. 7 prepared in Example 1, similarly to Example 5.

The slurry layer S was dried, and then, as FIG. 11(b) shows, the binder 40 was printed on the slurry layer S in a desired shape by use of the DoD type printhead 200 to form a binder layer B. The printed binder 40, that is, the binder layer B percolated through the dried electrode powder (silver powder) and reached the electrode substrate 20. Then, the electrode substrate 20 with the binder layer B thereon was maintained at 150° C. for 1 hour in the atmosphere of argon gas to thermally cure the binder 40.

Subsequently, as FIG. 11C shows, the electrode substrate 20 was placed in an ultrasonic cleaner 50 to be subjected to vibration for several seconds for the purpose of redispersion. The redispersion removed the electrode powder in the area where the percolation of the binder 40 did not occur, namely, the electrode powder in the area other than the binder layer B formed in a T shape was removed.

Figure 12A:
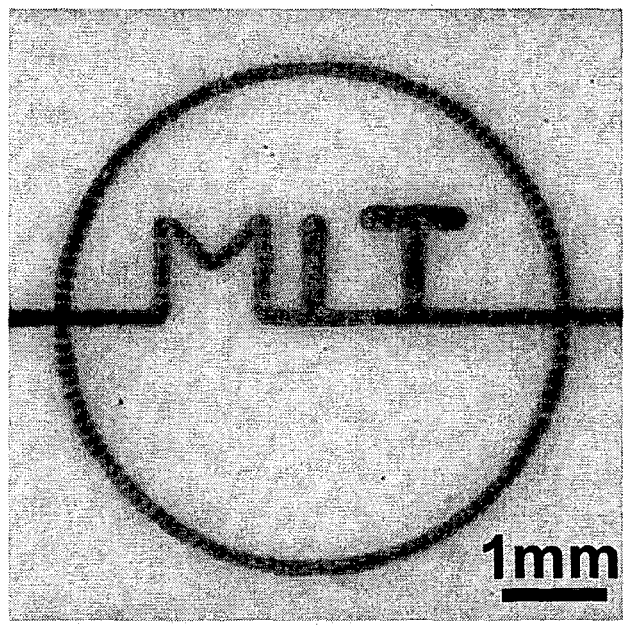
FIG. 12A shows an example of the conductor pattern.
Figure 12B:
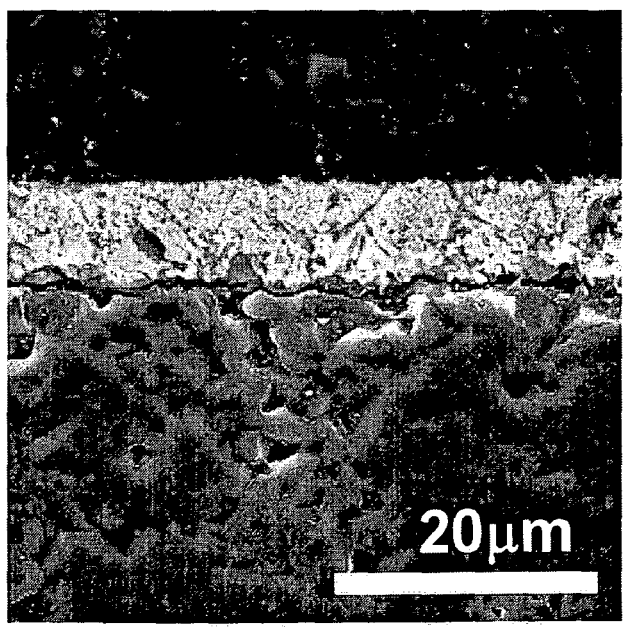
FIG. 12B shows a cross sectional view of a conductor.

Finally, as FIG. 11D shows, an electronic component could be fabricated which had the same shape of electrode pattern formed on the electrode substrate 20 as the binder layer B. The fabricated electrode had a line width of 100 to 120 μm. FIG. 12A shows an example of the conductor patterns fabricated in Example 6, and FIG. 12B shows the sectional view thereof. As can be seen from FIG. 12A, an electrode pattern finer than that in FIG. 9A was formed. While as can be seen from FIG. 12B a high density electrode film which is uniform in thickness was fabricated. When the electrode fabricated in Example 6 was energized, it could be confirmed that both ends of the electrode pattern were electrically continuous.

As detailed above, according to the present inventions, there can be obtained a metal slurry for electrode formation with which a high density electrode film can be formed and which is high in dispersion property. In addition, according to the present invention, there can be produced at a low cost and with a reliable method a metal slurry for electrode formation which is suitable for the jet printing technique. Furthermore, there can be reliably fabricated arbitrary electrode patterns by applying the metal slurry for electrode formation of the present invention to the jet printing technique.

Thus, this document discloses many related inventions.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any of such assemblies or groups are necessarily. patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

What is claimed is:

1. A metal slurry for electrode formation, comprising:
   a spherical metal powder having a mean particle size of 0.1 to 2.0 μm and a tap density of 3.0 g/cc or above; and
   a dispersion medium for dispersing said spherical metal powder, present in a volume % content ratio with the powder that is between 1:99 and 40:60 (powder: dispersion medium);
   said metal slurry having a sediment density of at least 50%.

2. A metal slurry for electrode formation according to claim 1, wherein said dispersion medium is selected from the group consisting of: water and lower molecular weight alcohols.

3. A metal slurry for electrode formation according to claim 1, wherein a dispersant is present in an amount of at most 10 wt % (exclusive of zero) in relation to said metal powder.

4. A metal slurry for electrode formation according to claim 1 wherein the viscosity of said metal slurry is at most 20 cps.

5. A metal slurry for electrode formation according to claim 1, wherein said metal powder comprises a silver powder.

6. A metal slurry for electrode formation according to claim 1, wherein said metal slurry is jet printable with a print head.

7. A metal slurry for electrode formation according to claim 6, wherein said metal slurry is jet printable with a continuous jet print head.

8. A production method of a metal slurry for electrode formation, which slurry comprises a mixture of a dispersion medium and a spherical metal powder present in a volume % content ratio that is between 1:99 and 40:60 (powder: dispersion medium); and has a sediment density of at least 50%, said method comprising the steps of preparing a spherical metal powder of 0.1 to 2.0 pin in mean particle size, having a tap density of 3.0 g/cc or above, and mixing together said metal powder and said dispersion medium.

9. A production method of the metal slurry for electrode formation according to claim 8, wherein said mixing comprises an ultrasonic vibration.

10. A production method of the metal slurry for electrode formation according to claim 8, wherein further addition of a dispersant is made to at least one of said dispersion medium and the mixture comprising said metal powder and said dispersion medium.

11. A production method of a metal slurry according to claim 8, wherein said metal powder comprises a silver powder.

12. A metal slurry for electrode formation, comprising:
    a spherical metal powder having a sphericity of 0.7 to 1.0 and a tap density of 3.0 g/cc or above; and
    water as a dispersion medium for dispersing said metal powder, wherein:
    said metal slurry has a sediment density of at least 50% and is jet printable with a print head.

13. A metal slurry for electrode formation according to claim 12, wherein said metal powder is produced by a reduction method.

14. A metal slurry for electrode formation according to claim 12, wherein said metal powder and said dispersion medium are present in a volume % content ratio between 1:99 and 40:60.

15. A metal slurry for electrode formation according to claim 12, wherein said metal powder comprises a silver powder.

16. A metal slurry for electrode formation according to claim 9, wherein the viscosity of said metal slurry is at most 20 cps.

* * * * *